(12) United States Patent
de Muizon et al.

(10) Patent No.: US 6,448,122 B1
(45) Date of Patent: Sep. 10, 2002

(54) METHOD AND DEVICE STRUCTURE FOR ENHANCED ESD PERFORMANCE

(75) Inventors: Emmanuel de Muizon, Fremont; Jeffrey Lutze, San Jose, both of CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/598,759

(22) Filed: Jun. 22, 2000

(51) Int. Cl.[7] .......................................... H01L 21/8238
(52) U.S. Cl. ...................................... 438/199; 438/303
(58) Field of Search ................................ 438/199, 301, 438/302, 303; 257/369

(56) References Cited

U.S. PATENT DOCUMENTS 6,162,692 A * 12/2000 Gardner et al. ............. 438/301
6,175,136 B1 * 1/2001 Okamura ..................... 257/369

* cited by examiner

*Primary Examiner*—David Nelms
*Assistant Examiner*—David Vu
(74) *Attorney, Agent, or Firm*—Peter Zawilski

(57) ABSTRACT

An integrated circuit manufacturing process selectively blocks silicide formation during the fabrication of I/O devices to enhance their ESD performance while not impacting the performance of core devices. In an example embodiment, a spacer dielectric covers the MOS structure so that the gate may be protected from process degradation. The spacer dielectric is masked to define silicidation blocking regions and silicidation accepting regions. Spacer dielectric is removed in regions where silicidation is to be accepted. Silicidation blocking regions protect transistor devices from subsequent ion implantation. Consequently, the ion implantation profiles for core transistors and I/O transistors are maintained for enhanced performance and reliability for each transistor type.

10 Claims, 4 Drawing Sheets

METHOD AND DEVICE STRUCTURE FOR ENHANCED ESD PERFORMANCE

FIELD OF INVENTION

The present invention is generally directed to the manufacture of a semiconductor device. In particular, the present invention relates to a process that provides for enhanced electrostatic discharge (ESD) protection in input/output transistors.

BACKGROUND OF INVENTION

Silicidation of diffusion and gate regions of MOS transistors is commonly used in sub-micron technologies to minimize electrical resistance. A serious consequence is the possible degradation of ESD performance. During an ESD event, the transistor is stressed with a large drain voltage. If this voltage exceeds a first breakdown voltage ($V_{t1}$) for the transistor, a drain snapback current flows. During this breakdown the transistor does not function as intended. It can resume normal operation once the ESD event is over. As soon as the current begins flowing, the drain voltage drops. However, if the ESD event is severe enough a second breakdown voltage ($V_{t2}$) is crossed, at which point the transistor is destroyed.

One approach to ESD resistance is to provide a large area for breakdown current to flow. This slows the excursion to $V_{t2}$, which in many cases can mean the device escapes destruction. A common technique to provide a large area for breakdown current to flow is to selectively prevent the silicidation on the drain side of input/output drivers. Having no silicidation adds extra diffusion resistance to the circuit. The extra diffusion resistance allows the current to be distributed across the full device width. It enables the circuit to share the ESD current discharge among all the structure on the MOS driver.

One conventional silicide blocking technique uses one or more additional dielectric layers that are deposited after the source and drain (S/D) implants and the subsequent rapid thermal annealing (RTA). A mask is applied and the dielectric is etched off everywhere on the wafer except where silicide exclusion is desired, usually in the I/O devices. A silicide, such as titanium silicide ($TiSi_x$), does not form on the dielectric. In an example process, the etch is done in two steps, a dry etch in a plasma followed by a wet etch to avoid damage to the silicon. The photomask is removed by conventional stripping. However, this approach often leads to increased junction or device leakage in non-excluded devices, namely the core devices. This leakage is caused by an attack on the isolation or spacer material during etching of the silicide exclusion. Device leakage affects the transistor's ability to receive and maintain an electric charge and is of particular importance for semiconductor memory. For example, the transistor holding a charge may represent a bit of data in the memory. The bit of data should not change state unless it is intended to change.

Refer to FIG. 1A. A conventional process to selectively silicide the source/drain regions of a MOS transistor may begin after the $N_{ldd}$ and $P_{ldd}$ masking and implanting steps of 5 and 10. To protect the gate a spacer deposition 15 forms a dielectric spacer on the gate regions. Undesired areas of the spacer are removed in a post spacer clean process 20. The N+ and P+ masking and implanting steps 25 and 30 provide the electrical connections to the source/drain regions. A rapid thermal anneal (RTA), 35 drives and activates the implant species. The process that enables the selective silicidation occurs in steps 40a–40e. Another dielectric deposition 40a, covers the features of the MOS substrate. A silicide-blocking mask 40b covers areas in which the dielectric deposition 40a is to remain. Other areas, such as source/drain regions in which it is desired to have silicide, are exposed. A dry etch 40c and a wet etch 40d etch the exposed regions. A resist strip 40e removes the photo resist. The substrate undergoes a pre-cleaning 45 prior to the refractory metal deposition 50. In many processes, titanium or cobalt is used. Areas upon which the silicide blocking mask 40b is present, do not silicide. However, the selective silicidation adds a significant number of steps 40a–40e that may not be present in a process not having selective silicidation. The resulting structure is depicted in FIG. 1B.

Refer to FIG. 1B. An example input MOS structure 100 has been fabricated with silicide blocking. It may include a substrate 110 and a P-well 120 surrounded by trench isolation regions 130. The implant regions 140 and 140a are the lightly doped drain (LDD) and N+ implants respectively. The poly-silicon gate 170, is protected by dielectric spacers 160. A silicide blocking layer 180, protects the implant regions 140, and 140a from silicide 150. After the silicidation, a dielectric layer 190 is deposited on the device. Contact regions 200 are defined in the dielectric layer 190 to connect the device via the silicided regions 150 to conductive lines 210.

As in the aforementioned selective masking technique, having no silicidation adds extra diffusion resistance to the circuit, allowing the current to distribute across the device width. It enables the circuit to share the ESD current discharge among all the structure on the NMOS driver.

However, the technique increases the complexity of the device processing in that additional masking and etching steps oftentimes are used to implement the selective silicidation of source/drain regions. The extra processing steps increase product costs and may affect device reliability.

Another silicide blocking technique is outlined in U.S. Pat. No. 5,413,969 titled "Differential Treatment to Selectively Avoid Silicide Formation on ESD I/O Transistors in a Salicide Process," issued to T. Y. Huang on May 9, 1995 and assigned to VLSI Technology, Inc. and incorporated by reference, herein. The technique involves differentially treating source/drain regions of, for example, input transistors and input/output (I/O) transistors of a device, by selectively implanting species, such as arsenic into source/drain regions of the I/O transistors in which is not desired to form silicide. Titanium is deposited on both the source/drain regions and then annealed at a temperature that forms a silicide in the non-implanted regions. After annealing, the unreacted metal is stripped off the implanted regions.

There exists a need to be able to selectively block silicidation in I/O transistors to enhance ESD performance, maintain the performance of the core transistors, and minimize product costs.

SUMMARY OF INVENTION

The present invention is exemplified in a number of implementations, two of which is summarized below. A modification to the application of a spacer dielectric to the gate region of a MOS transistor enables the formation of the dielectric spacer to selectively block the silicidation of areas on the transistor and to block areas from ion implantation. In accordance with an embodiment of the invention, a method selectively blocks silicidation of a MOS transistor structure. The MOS structure has a substrate area of a first polarity type, a source and drain region of a second polarity type and a silicon gate over a thin oxide on the substrate area. The method comprises depositing a spacer dielectric that covers the MOS structure. The spacer dielectric is then masked to define silicidation blocking regions and silicidation accepting regions. In silicidation accepting regions, the spacer dielectric is removed. An additional feature of this embodiment is that species are implanted in the silicidation accepting regions. The MOS transistor structure is then annealed to activate the species. The silicide-accepting regions have a refractory metal deposited thereon. Again, the MOS structure is annealed to form the refractory metal silicide. These silicide-accepting regions may be the gate, source or drain of the MOS transistor structure.

In accordance with another embodiment of the present invention, an MOS transistor comprises a source region of a first polarity type and a drain region having a first implant region of a first polarity type. A gate region has a spacer dielectric disposed upon a predetermined portion thereof and it covers a predetermined portion of the first implant region. The spacer dielectric also partially extends to a drain contact within the drain region. The drain contact has a second implant region of a first polarity type substantially within the first implant region. A channel region of a second polarity is below the gate. The channel region includes a channel adjacent the gate and extends between the source region and drain region. An additional feature of this embodiment is that the spacer dielectric may be of the following dielectrics, silicon oxide, silicon-rich oxide, and silicon nitride.

The above summary of the present invention is not intended to represent each disclosed embodiment, or every aspect, of the present invention. Other aspects and example embodiments are provided in the figures and the detailed description that follows.

BRIEF DESCRIPTION OF THE DRAWINGS

The invention may be more completely understood in consideration of the following detailed description of various embodiments of the invention in connection with the accompanying drawings, in which.

Figure 1A:
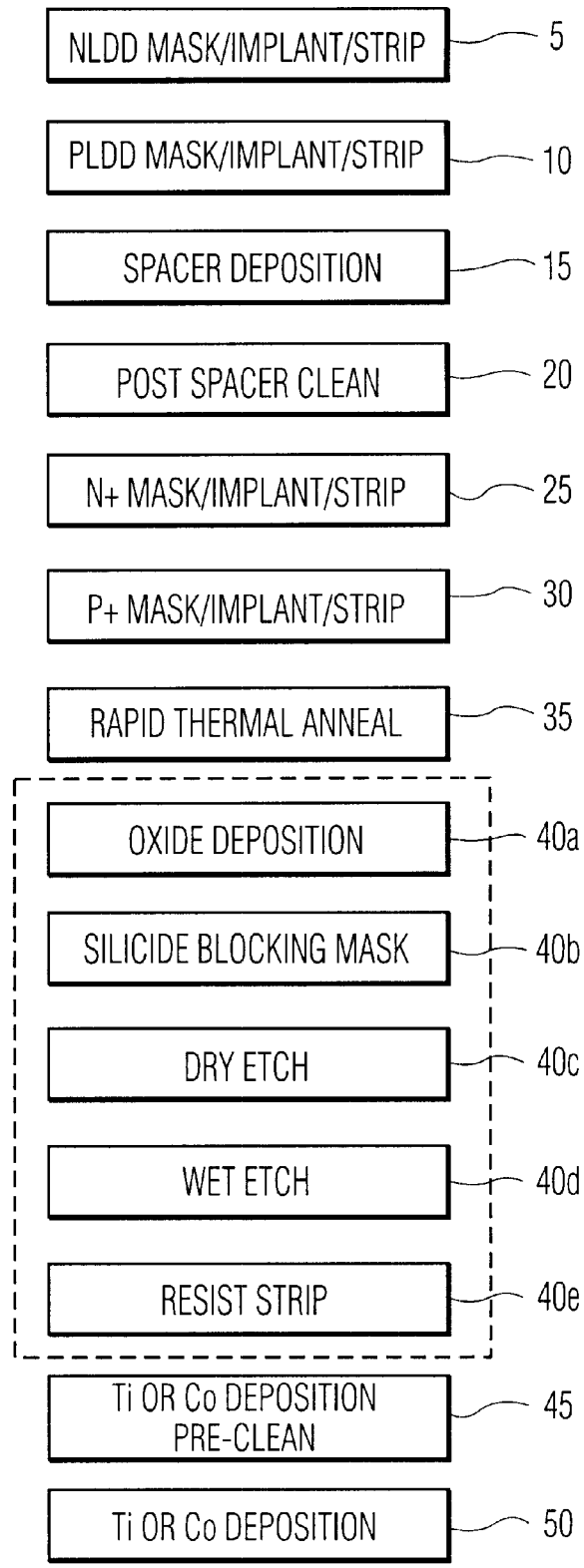
FIG. 1A illustrates a conventional process flow for silicide exclusion.
Figure 1B:
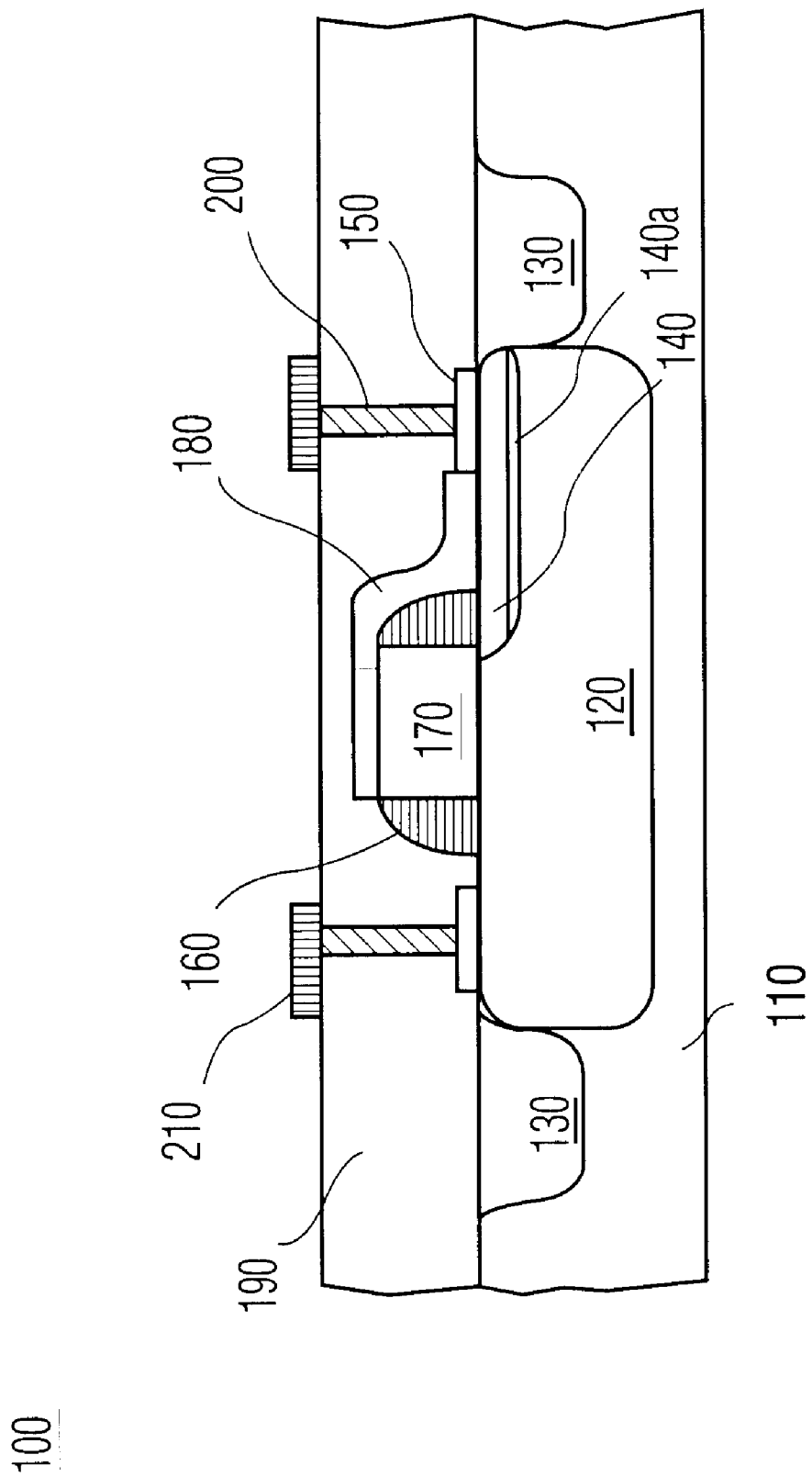
FIG. 1B depicts a cross-section of an NMOS input driver built by the process outlined in FIG. 1A.

While the invention is susceptible to various modifications and alternative forms, specific embodiments thereof have been shown by way of example in the drawings and will herein be described in detail.

DETAILED DESCRIPTION

The present invention has been found to be useful and advantageous in connection with providing a distributed series resistance in the drain region of I/O drivers for enhanced ESD performance by blocking the formation of silicide in the I/O devices without impacting the performance of core devices. In the discussion that follows, a MOS structure is used to describe an example implementation of the invention. However, the invention is not so limited.

A masking step is included during the spacer etch process that builds dielectric spacers surrounding the gate regions of the transistor devices so that spacer dielectric is retained on part of the gate and on part of the drain of an I/O driver. The spacer dielectric may be an oxide, nitride, or other suitable material. The masked portion of the spacer prevents the formation of silicide. Drain resistance is constituted by the implants that are performed prior to spacer deposition. In modern sub-micron processes these usually are the $L_{dd}$ or drain extension implants.

Figure 2:
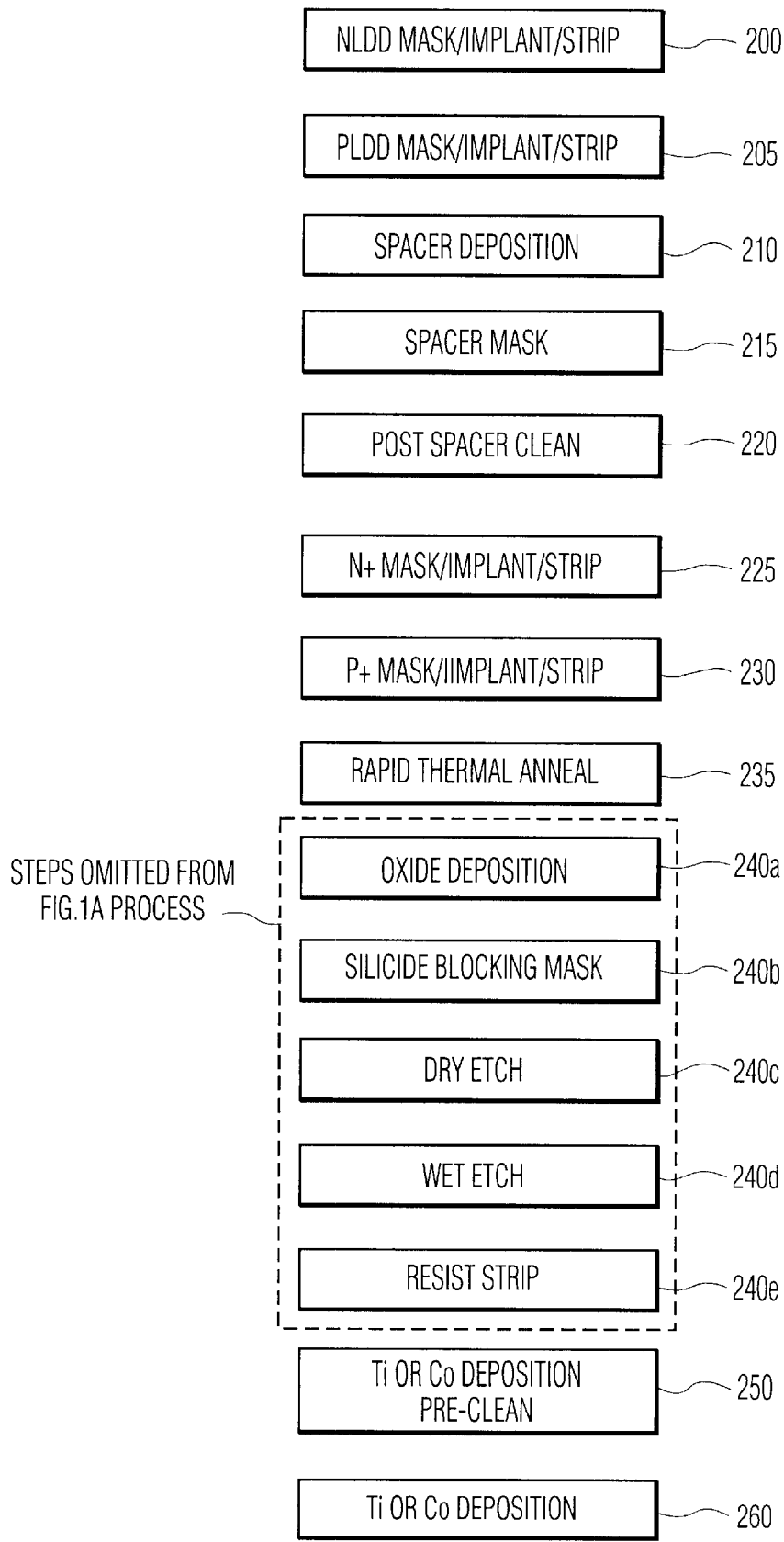
FIG. 2 illustrates a process flow according to an embodiment of the invention.

In an example embodiment according to the present invention, as shown in FIG. 2, a transistor structure undergoes $N_{ldd}$ and $P_{ldd}$ (lightly doped drain) implant processes during steps 200 and 205 for the N-type and P-type devices in a CMOS transistor structure. After implant, a spacer deposition 210 is formed on the structure. A spacer mask 215 is applied to areas in which subsequent silicidation is not desired. The spacer mask 215 protects underlying regions against N+ and P+ implant at steps 225 and 230. According to an embodiment of the present invention, steps 240a through 240e represent processing steps 40a–40e illustrated in FIG. 1A that are eliminated. A rapid thermal anneal (RTA) 235 activates the implant species in the source and drain regions. A pre-cleaning process 250 prepares the regions undergoing silicidation. After the pre-cleaning, a refractory metal such as titanium or cobalt is deposited 260. Other metals that may form silicides include molybdenum, tantalum, tungsten, platinum, palladium, and nickel. Those regions undergoing silicidation are areas in which silicon is exposed. In temperatures of up to 1000° C., the silicon reacts with the refractory metals forming silicide compounds.

The structure manufactured by the above process may be further understood by examining a series of cross-sections of FIGS. 3A–3D.

Figure 3A:
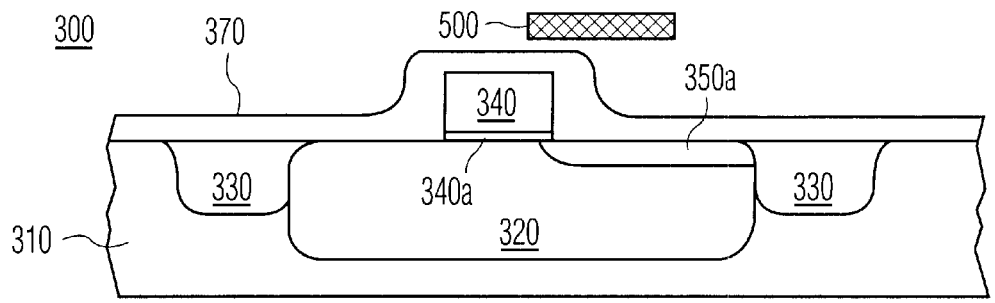
FIG. 3A illustrates in cross-section a MOS transistor structure built by the process outlined after spacer deposition during spacer mask.

Refer to FIG. 3A. An example transistor structure 300 of an I/O driver has been built according to an embodiment of the present invention. A substrate 310 has a well region 320 surrounded by trench isolation 330. Within the well 320, an $L_{dd}$ implant region 350a define a source/drain region. The gate region 340 is on top of the well region 320. Spacer dielectric 370 has applied and a photomask 500 defines the area over the $L_{dd}$ implant 350a that is protected with a spacer dielectric.

Figure 3B:
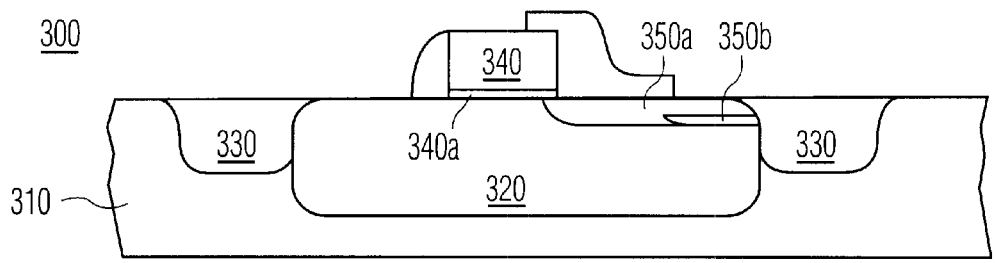
FIG. 3B illustrates the cross-section of FIG. 3A after post spacer clean and N+/P+ implants.

Refer to FIG. 3B. After etching the transistor structure 300, the photomask 500 is removed. The spacer dielectric 370a and 370b remain and protects the underlying $L_{dd}$ implant region 350a from subsequent implants. A heavily doped region 350b is obtained after N+/P+ implants. The gate region 340 is protected by spacer dielectric 370a and 370b. This gate region 340 typically is a poly-silicon or amorphous silicon doped to have sufficient electrical conductivity. Under the gate region 340 is usually a thin oxide layer 340a to isolate the gate region 340 from the well 320.

Figure 3C:
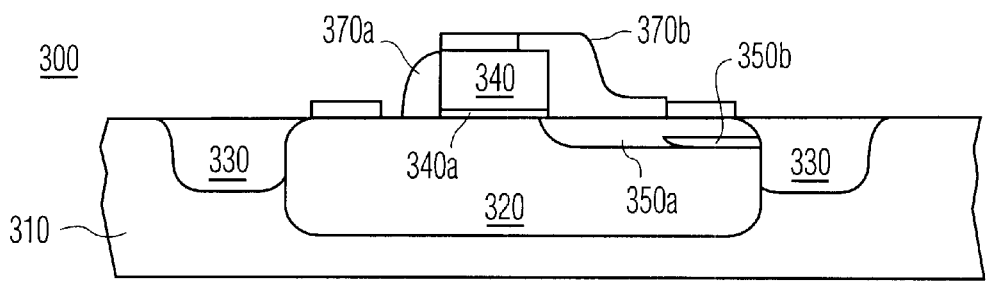
FIG. 3C depicts FIG. 3B after the selective silicidation of a refractory metal.

Refer to FIG. 3C. Silicidation defines contact regions 360a, 360b, and 360c. Those areas not having dielectric accept the refractory metal. The contact regions 360a, 360b, and 360c enable electrical contact with the active transistor structure 300.

Figure 3D:
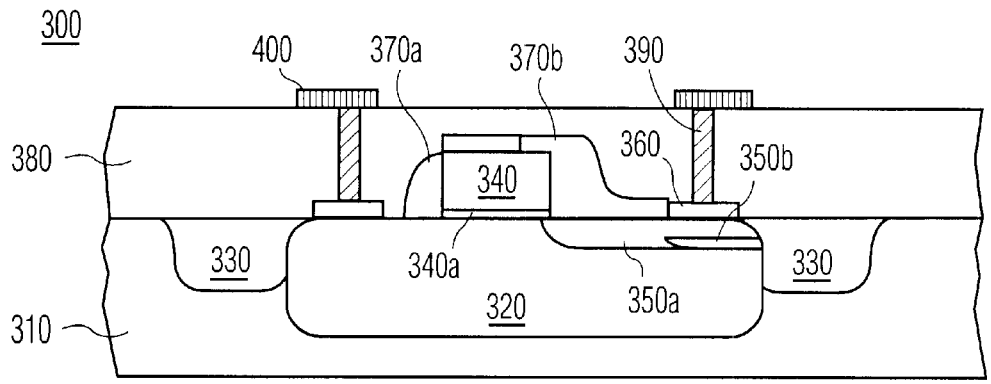
FIG. 3D depicts the MOS transistor structure of 3C with contacts and metal.

Refer to FIG. 3D. A dielectric layer 380 covers the source/drain region and the gate. Contacts 390 are defined and filled with a conductive material. Such a conductive material may be a tungsten plug or other suitable metal. Metallization 400 on top of the filled contacts 390 provides electrical connection to the active transistor 300.

The $L_{dd}$ drain protected by the extended spacer dielectric has sufficient sheet resistance to avoid current crowding and uniformly share the ESD current discharge through the NMOS driver. The particular configuration of the NMOS driver is determined by the process and circuit application. The layout of NMOS drivers is well known in the art. An example of a CMOS output buffer, upon which the present invention may be applicable is outlined in U.S. Pat. No. 5,517,049 titled "CMOS Output Buffer with Enhanced ESD Resistance," issued to T. Y. Huang on May 14, 1996 and assigned to VLSI Technology, Inc. and incorporated by reference, herein.

While the present invention has been described with reference to several particular example embodiments, those skilled in the art will recognize that many changes may be made thereto without departing from the spirit and scope of the present invention, which is set forth in the following claims.

What is claimed:

1. A method for selectively blocking silicidation of a MOS transistor structure, the MOS structure having a substrate area of a first polarity type, a source region and drain region of a second polarity type, and a silicon gate over a thin oxide on the substrate area, the method comprising:

depositing a spacer dielectric covering the MOS transistor structure;

masking the spacer dielectric to define silicidation blocking regions and silicidation accepting regions; and removing the spacer dielectric from the silicidation accepting regions.

2. The method of claim 1 wherein after removing the spacer dielectric from the silicidation accepting regions, the method further comprises:

implanting species in the silicidation accepting regions;

annealing the MOS transistor structure to activate the species; and depositing a refractory metal on the MOS structure wherein the refractory metal bonds to the silicidation accepting regions; and annealing the MOS structure to form a refractory metal silicide in the silicidation accepting regions.

3. The method of claim 2 wherein the silicidation accepting regions are from the following: the source region, the drain region, and the silicon gate.

4. The method of claim 1 wherein the spacer dielectric comprises at least one of the following: silicon oxide, silicon-rich oxide, silicon nitride.

5. The method of claim 2 wherein the species comprises at least one of the following: species of a first polarity type, species of a second polarity type.

6. The method of claim 1 wherein the first polarity type is opposite of the second polarity type.

7. The method of claim 1 wherein the first polarity type is positive and the second polarity type is negative.

8. The method of claim 1 wherein the first polarity type is negative and the second polarity type is positive.

9. The method of claim 3 wherein the source region and the drain region each include a heavily doped section and a lightly doped section.

10. The method of claim 1, wherein the method is used to manufacture an integrated circuit.

* * * * *